United States Patent [19]

Brusati et al.

[11] Patent Number: 5,081,773
[45] Date of Patent: Jan. 21, 1992

[54] OVEN FOR DRYING OR CURING A PHOTOSENSITIVE MATERIAL APPLIED AS A COATING ON A SUBSTRATE

[75] Inventors: Ernesto Brusati, San Rocco Al Porto; Alessandro Garioni, S. Colombano Al Lambro, both of Italy

[73] Assignee: Vibrosystem S.r.l., Milan, Italy

[21] Appl. No.: 448,846

[22] Filed: Dec. 12, 1989

[30] Foreign Application Priority Data

Dec. 14, 1988 [IT] Italy .............................. 22942 A/88

[51] Int. Cl.⁵ .............................................. F26B 25/00
[52] U.S. Cl. ........................................ 34/205; 34/236
[58] Field of Search ................ 34/207, 208, 150, 236, 34/205, 107, 203

[56] References Cited

U.S. PATENT DOCUMENTS 1,753,998  4/1930  Podel .............................. 34/150 X
2,632,961  3/1953  Robertson ........................ 34/207 X Primary Examiner—Henry A. Bennett

[57] ABSTRACT

An improved type of oven is disclosed for drying or curing a photosensitive material applied by coating on a substrate or board.

The oven substantially comprises a substrate or board feeding station provided with a device for centering the boards, and which leads them, one by one, into the oven. Within the oven there is provided a first operating unit adapted to subject the substrates or boards to a rising motion, all the way up to the upper end thereof, where a device is provided to transfer one substrate or board at a time to a second operating unit, substantially identical to the first one, adapted to subject the substrates or boards to a lowering motion. At the lower end of the second operating unit there is provided a device for withdrawing and unloading those substrates or boards where the material has dried up or cured.

A device is also provided within the oven to heat the substrates or boards and there is further provided a cooling circuit for the outgoing substrates or boards, and eventually a safety device adapted to draw a vacuum within the oven when the inspection doors are opened while the oven is operating, in order to prevent noxiuos vapours from escaping out of the oven.

9 Claims, 4 Drawing Sheets

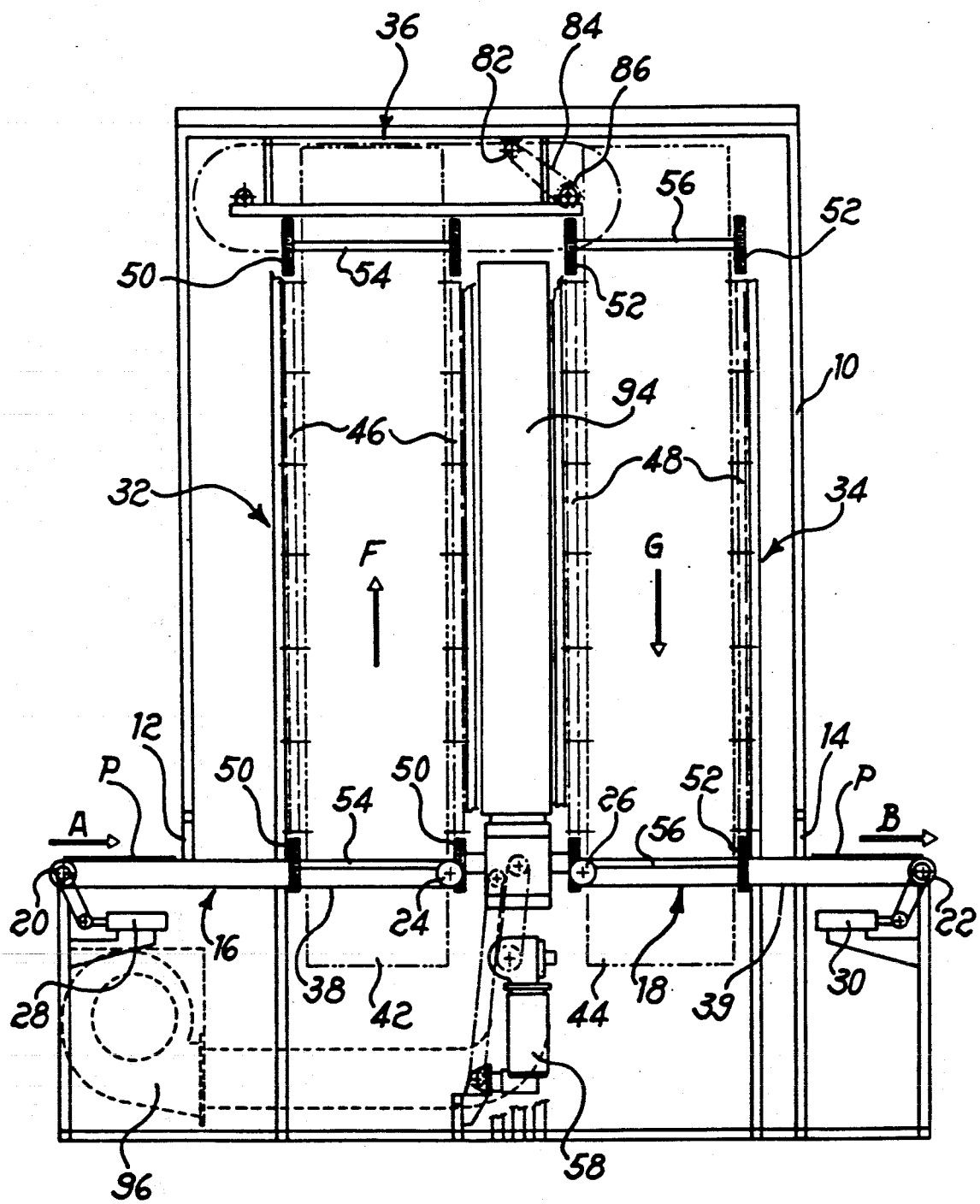

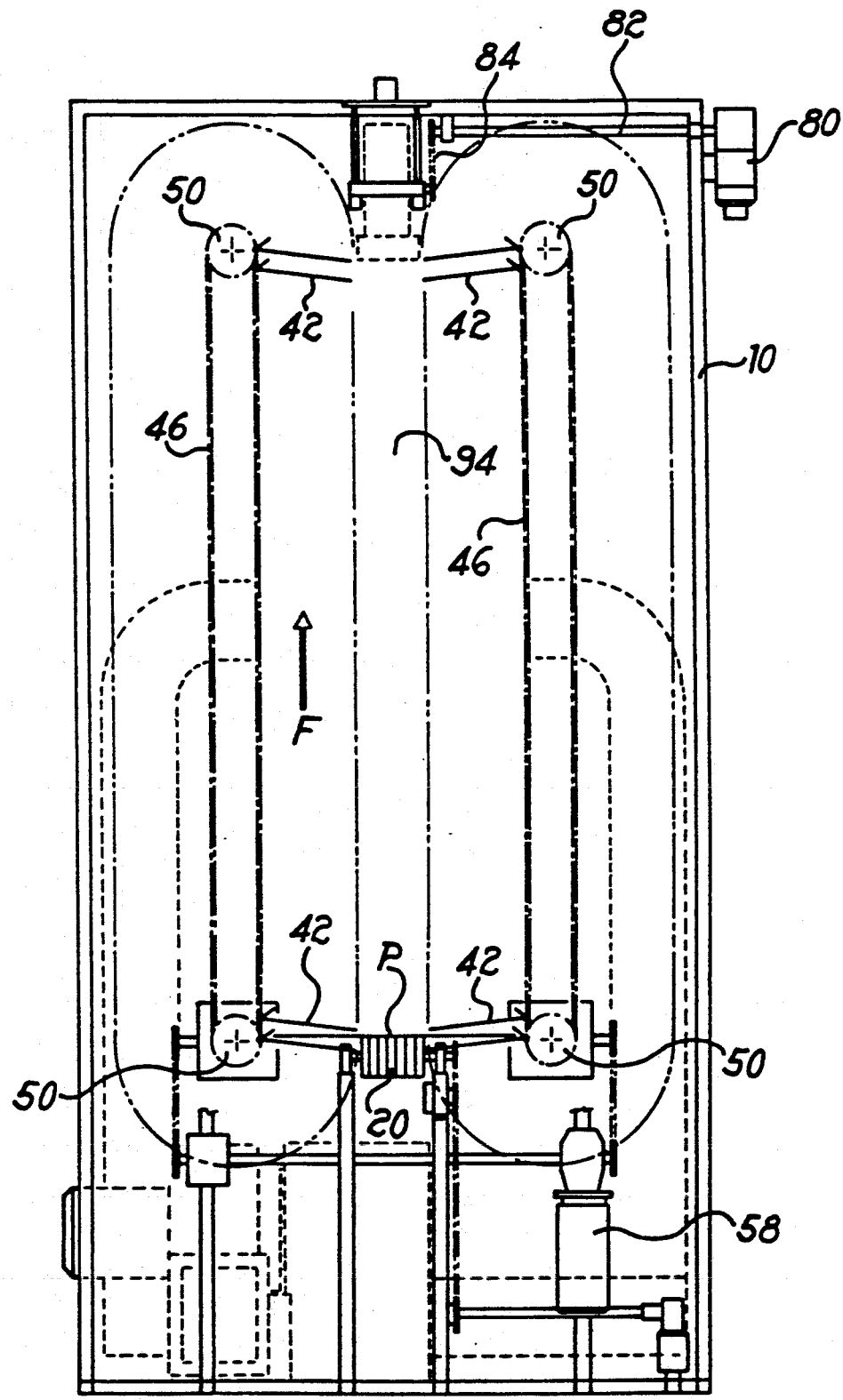

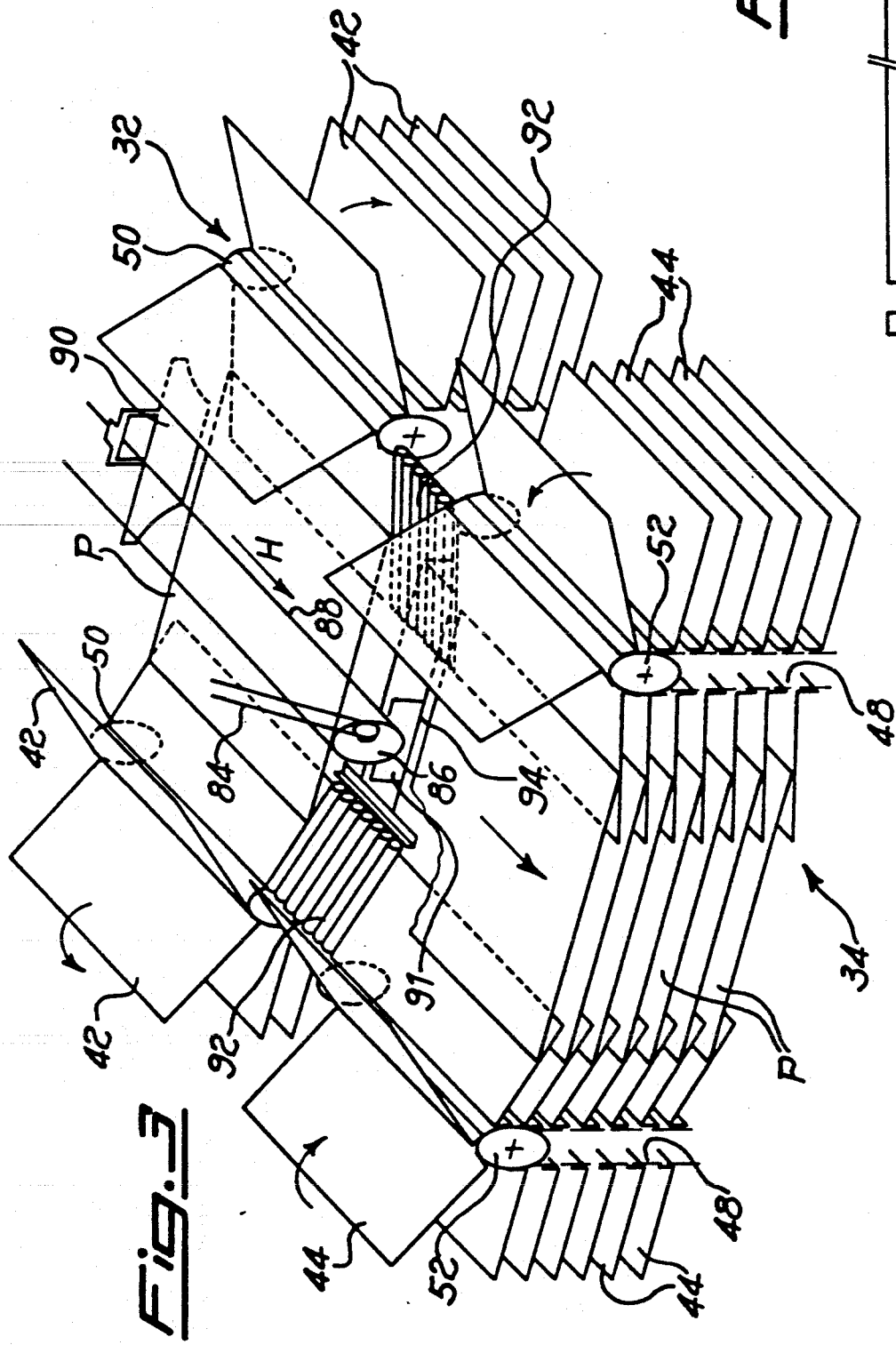

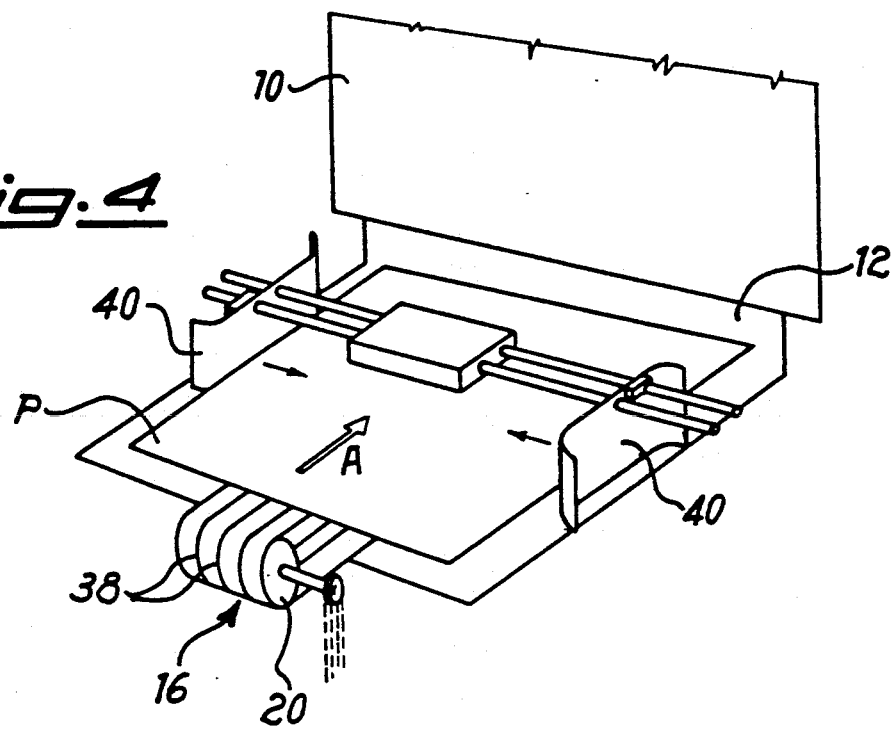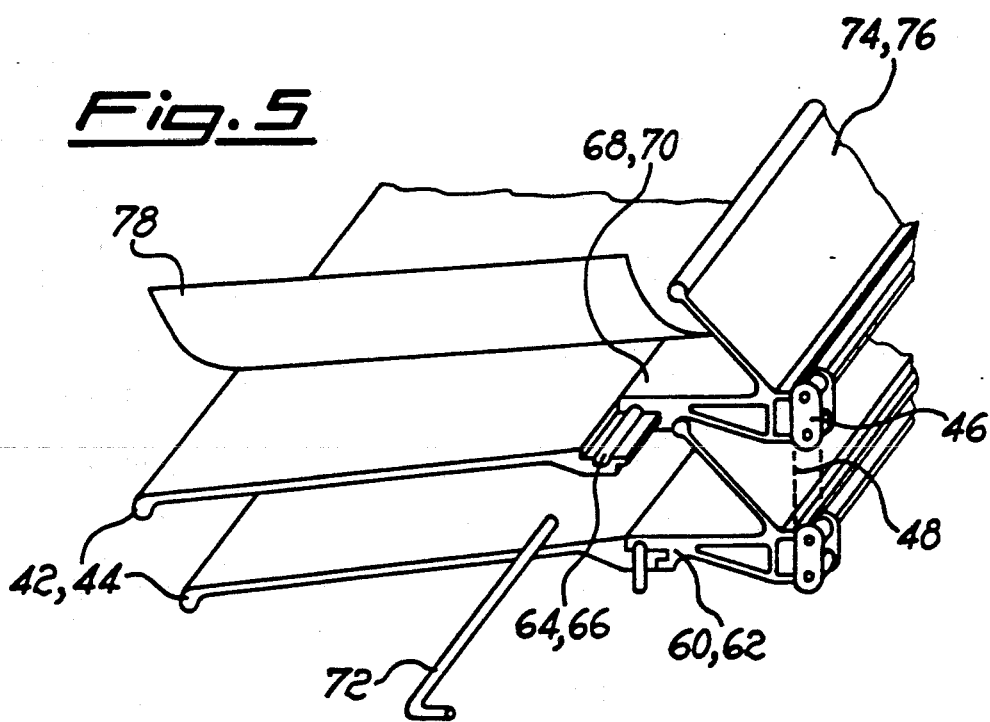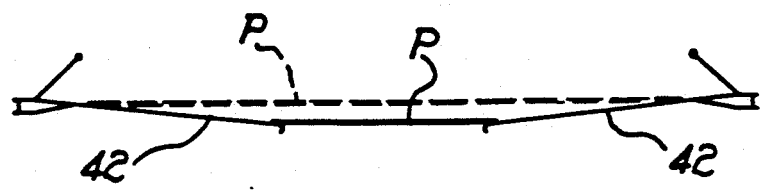

OVEN FOR DRYING OR CURING A PHOTOSENSITIVE MATERIAL APPLIED AS A COATING ON A SUBSTRATE

BACKGROUND OF THE INVENTION

1. Field of the Invention

This invention concerns an improved drying and curing oven for photosensitive materials applied as a coating on a substrate.

2. Description of Related Art

A typical example of a product where the oven according to this invention is used is a printed circuit board. In this case the oven is used to process fiberglass boards, having applied as a coating thereon, through silk screening, spraying, glazing or some other process, the material which will actually comprise the electric circuits, after the substrate has been unloaded off the oven and exposed to light.

Ovens of the subject type are already known, and they may be grouped in two broad families wherein the first comprises stationary ovens, while the second comprises dynamic or semi-stationary ovens.

The ovens of both families mentioned above are suitable for treating rigid or semi-rigid substrates or boards made of fiberglass, bakelite or similar materials, having applied as a coating thereon a photosensitive material, under the form of a liquid film. The applied material is made to adhere to the substrate or board, and made to dry up thereon through a suitable thermal cycle whereby it acquires all the properties required for performing the following photo-exposure process.

In the ovens of the first family, the substrates or boards are mounted on suitable carriages or racks, and they are heated by means of a flow of hot air, or through other heat sources, for a predetermined period of time. A first drawback of these ovens derives from the fact that the boards or racks must be subjected to handling, which results in a particular disadvantage at the beginning of the processing, when the material applied by coating to the board is still in a liquid phase whereby, if the board gets even slightly tilted, the material may trickle down, or cause thickness differences, or it may in any case modify the conditions under which the material was applied by coating onto the board. Therefore, the final product will be unfit for usage.

Another drawback of this type of ovens derives from the fact that the internal thermal balance of the oven is upset any time the feeding doors thereof are opened in order to load substrates or boards, and a large mass of cold air is allowed to enter into the oven. Furthermore the opening operation causes a heat loss to the outside and the danger that harmful vapours will propagate through the enclosed areas where the oven is operating, jeopardizing the operator's safety.

Some of the drawbacks mentioned above were partially done away with by providing the oven with exhausters, fans or other additional devices which, besides having proved not completely effective, were particularly expensive, resulting in non-competitive oven operations. Since the ovens of the second family are provided with means for substrate or board handling, they necessarily require the means for handling to be adjusted and set-up when the shape of the substrates or boards to be processed changes. The above causes idle times and a loss of flexibility and of dynamic response of the manufacturing lines where the oven is installed.

It should further be noted that all the handling means control devices make the oven more prone to frequent operations of maintenance, cheking and part replacement. There has now been contrived, and it is the subject of this invention, a substrate or board processing oven, as defined herein above, which does away with all the drawbacks of the ovens already known in the art.

SUMMARY OF THE INVENTION

In particular, the inventive oven is a dynamic type oven, in that the substrates or boards are handled even though the substrates or boards proceed through the oven in a horizontal position and, when they must be subjected to a few degrees tilting relative to horizontal, they are already in such a dried-up condition that the material has completely adhered thereto.

A further remarkable feature of the inventive oven derives from the fact that the substrate or board loading operation is no cause for cold air intake into the oven, whereby the thermal balance thereof remains unchanged.

A still further remarkable feature of the oven of this invention is achived through the provision of a device adapted to draw a vacuum within the oven whereby, as the oven doors are opened for instance for inspection purposes, the harmful vapours are prevented from propagating through the surrounding enclosed areas.

An additional feature which is not to be forgotten, is based on the fact that in the inventive oven different size substrates or boards can be processed without requiring the control systems which are instead necessary in the known type ovens.

BRIEF DESCRIPTION OF THE DRAWINGS

The features as well as the advantages of the oven according to this invention will become apparent from the following detailed description of a non limiting embodiment thereof, made in reference to the attached Figures, wherein:

FIG. 1 is a general side elevational view showing schematically the oven according to this invention;

FIG. 2 is a further schematical side elevational view of the inventive oven, taken at 90° relative to FIG. 1;

FIG. 3 is a perspective view partially and schematically showing the substrate or board handling means within the oven;

FIG. 4 is a perspective view which shows schematically the substrate or board loading station into the oven;

FIG. 5 is a partially broken away enlarged perspective view showing some of the means for substrate or board handling within the oven;

FIG. 6 is a schematic front view showing one of the substrate or board handling means within the oven; and FIG. 7 is an enlarged scale view showing in particular the means for substrate or board handling within the oven.

DETAILED DESCRIPTION OF PREFERRED EMBODIMENTS

Referring first of all to FIGS. 1 and 2, the oven of this invention is described in general herein, while the details thereof will be described in the following, reference being made to the following drawings.

The inventive oven comprises an outer structure or housing 10 within which substrate or board processing is performed. Housing 10 is provided, on a pair of opposite side faces, with an opening 12 through which the substrates or boards to be processed are loaded into the oven, and an opening 14 through which the processed substrates or boards are unloaded off the oven.

At either opening 12 and 14, means are provided to forward the substrates or boards, in particular according to the direction of arrow A towards the oven interior, and according to the direction of arrow B outwards from the oven, said means which are briefly described above thereby comprising the oven loading and unloading station, respectively.

Both of the handling means mentioned above comprise a belt conveyor, 16 and 18 respectively, winding around a drive roller 20, 22 and around an idle roller 24, 26. Drive rollers 20, 22 are actuated in turn by a gearbox 28, 30, provided to control the forward motion of conveyor belts 16, 18, in a coordinated fashion with actuation of the other substrate or board handling means, as it is described in the following.

As it is apparent in particular in FIG. 1, both conveyor belts 16, 18 extend partially outside housing 10 and partially towards the inside thereof, whereby substrates or boards P are fed in or withdrawn, respectively, by the means provided to handle the substrates or boards within the oven.

The oven further comprises, still generally speaking, a first and a second operating unit, shown at 32 and 34 respectively, wherein the first is adapted to subject the substrates or boards to a rising motion (arrow F of FIG. 1) while the second subjects the substrates to a downwards motion (arrow G of FIG. 1).

At the top end of units 32, 34 there is provided a station 36 for transferring the substrates or boards, one at a time, from unit 32 to unit 34.

Referring now in particular to FIG. 4, some embodimental details of the substrate or board loading station of the oven are described.

From the Figure mentioned above it can be noticed that belt conveyor 16 (as well as belt conveyor 18) actually comprises a number of circular cross-section belts 38 (39 for belt 18), in order to reduce the contact surface between conveyor belt 16 (18) and substrates or boards P to a required minimum.

Furthermore, substrates or boards P, before they are loaded into the oven, are led through positioning means comprised of a pair of movable walls 40, adapted to align the longitudinal centerline of substrate or board P with an axis located at the same distance apart from both operating units 32 and 34, as it will be explained in the following, in the same way as it will be explained regarding the remarkable importance of this operating step.

Referring now also to FIGS. 3, 5 and 6, in addition to FIGS. 3, 5 and 6, the operating units 32 and 34 are described in the following.

The operating units extend in a substantially vertical direction and are flanking each other. Each unit 32, 34 includes two sets of shelves 42, 44 supported, on one side thereof, by a pair of chains 46, 48, winding around sprockets 50, 52 mounted on shafts 54, 56.

Shafts 54, 56 located at the bottom end of units 32, 34 are connected, as it is shown schematically in FIG. 1, by means of a known transmission, to a drive motor 58 which, through the transmission comprising for instance two opposed T-shaped inverting reduction gears, transmits a motion to chains 46, 48 in such a way that opposed shelves 42 whereon the substrates or boards are progressively unloaded are made to rise (arrow F of FIGS. 1 and 2), while opposed shelves 44 where the panels will be unloaded from, are moved downwards (arrow G of FIG. 1). As it may be seen in particular in FIG. 1, the length of driving roller 20, as well as that of rollers 24, 26 and 22, not shown in FIG. 1, is shorter than the distance between opposed edges of shelves 42, 44. In this way, in the oven loading station, conveyor belt 16 will be allowed to move forward all the way to bring substrate or board P to the area located between two shelves 42, opposed to each other and beneath the conveyor, whereupon the shelves will be raised in order to allow substrate or board P to lean thereon at the end edges thereof. In a similar fashion, in the unloading station off the oven, shelves 44 will be lowered until substrate or board P comes to rest on conveyor belt 18, whereupon the latter is actuated to take substrate or board P to the outside of the oven.

The various driving functions mentioned above will be properly coordinated by known programming means, not shown or decribed in detail herein.

At this point the importance of the centering and alining device provided at the oven entrance and comprising movable walls 40 should be emphasized, and this subject may be further emphasized by referring in particular to FIG. 6, which shows schematically how substrate or board P comes into engagement with shelves 42 and is supported thereby.

Even though in reality each pair of opposed shelves 42 supports one substrate or board P at a time, in said FIG. 6 there has been shown a substrate or board P in full lines and a second one in broken lines, in order to show how shelves 42 may support panels having a length included among those shown in FIG. 6. It should further be noticed that shelves 42 are sloping downwards, starting from the supporting chains, in a mutually symmetrical arrangement. Taking this feature into account, the contact between substrate or board P and shelf 42 is limited only to the end edges thereof.

Centering and aligning of substrate or board P are important factors as well, in that the substrate rests on shelves 42 in a perfectly horizontal position, which is important in that the material which was applied by coating on the substrate or board, is not yet stabilized during the entire rising stroke whereby, were the panel to tilt, the material might trickle down or cause differences in thickness, making the substrate or board unfit for usage.

Referring now in particular to FIG. 5, further inventive features relating to shelves 42 and 44 are described. First of all, it may be noticed in FIG. 5 that shelves 42, 44 are supported by a cross member 60, 62 being supported in turn, on opposite sides, by chains 46, 48. Shelves 42, 44 are mounted on cross members 60, 62 by inserting properly shaped back sides 64, 66 into a correspondingly shaped groove 68, 70 of cross members 60, 62. Both the contoured shelf edge and the cross member groove enables a locking pin 72 to be inserted, which securely fastens the shelves to the cross members.

It may further be noticed in FIG. 5 that cross members 60, 62 have an upwards angled portion or projection 74, 76 whose end edge comes into engagement with the lower side of the cross member located above. In this way, projections 74, 76 comprise a stop or locking means adapted to prevent possible cross member rotations caused by the weight of substrates or boards P, whereby the postion of shelves 42, 44 remains unchanged.

According to a further advantageous feature of this invention, on the face of shelves 42, 44 where substrate or board P is supported there is provided a lining 78 of a material adapted to prevent the substrate or board from sticking to the shelf, or any scratching of the substrate, and this is particularly convenient when the substrate or board has to be transferred from one operating unit to another by means of transfer station 36 described herein in the following, referring in particular to FIGS. 1, 2 and 3.

The station includes a drive motor 80 whose shaft 82, by means of a cog belt transmission 84, rotatingly drives a sprocket 86 rotatingly mounted on a structure 10 and carrying a further cog belt 88 wound therearound and provided with a plate shaped pusher member 90 fastened thereto in any known way, and with a facing stop member 91 adapted to engage with the back side and with the front side of substrate or board P (FIG. 3) whereby, when the latter has reached the top end of operating unit 32, it is pushed according to the direction of arrow H, all the way to position the substrate on the upper end of second operating unit 34. In the empty region between the pair of operating units 32, 34, support means are provided for the substrate or board, while it is being transferred from one unit to the other, the support means comprising two sets of small rotating rollers 92 partially filling the empty area without any gaps therebetween. Small rollers 92 have the same length as shelves 42 and 44, and they are sloping downwards with the same angle.

As it can further be seen in FIG. 3, within the area defined by operating units 32, 34 upper ends and by small rollers 92, there opens the end of a line 94 feeding out of a hot air source 96 which is only schematically shown, being known per se.

The oven according to this invention further includes a set of suction units, properly located therein to dispose of the solvent vapours emanating from the substrates or boards while they are being processed, so that no harmful vapours can stagnate and give problems relating to the internal environment of the oven or to the proper operation thereof.

Furthermore, the subject oven is provided with means adapted to automatically draw a vacuum within the oven when the latter is opened for routine inspections while the oven is in operation.

The oven according to this invention further includes a hot air recirculating line provided in order to prevent possible damage, and in particular dangerous deflagrations in the area of the heating means comprising, for instance, electric resistances.

Eventually, the oven includes a substrate or board cooling circuit, at the exit from the oven, whereby the substrates are provided cold to the following manufacturing operations. The inventive oven operating cycle should be apparent from the above description and in particular it includes gradually heating the substrates or boards during rising motion thereof, up to a maximum temperature when they are transferred from the upper end of the first operating unit to that of the second. In this step, the material applied by coating on the substrate or board is completely dried up. During the substrate lowering stroke the coating material is stabilized and the substrate or board is cooled off, in the last part of the lowering stroke.

It should eventually be understood that variations and/or modifications may be made to the oven according to this invention, without exceeding the protection scope of the claimed invention.

What we claim is:

1. An improved oven for drying or curing a photosensitive material applied by coating on a board comprising, within a support structure:
   means for heating said board;
   means for handling said board including at least one pair of vertically arranged operating units, a first unit transporting said board vertically upwards and a second unit transporting said board vertically downward to a discharge area; and
   an independently operable transfer station for transferring said board from the first operating unit to the second operating unit;
   wherein each of said operating units includes two sets of support shelves, each set of support shelves being carried by a pair of handling chains connected to driving means, on the support shelves opposite to each other along the rising and lowering stroke respectively, there being horizontally located boards to be processed.

2. The oven of claims 1, characterized in that, at the area for loading boards into the oven, there is provided means for centering and aligning boards relative to a centerline equally spaced from the opposite edges of said shelves.

3. The oven of claim 1, characterized in that feeding the boards into the oven and withdrawing them therefrom are performed by a plurality of transfer belts arranged at the ends thereof around drive rollers whose length is shorter than the distance between the opposite edges of said support shelves.

4. The oven of claim 3, characterized in that said transfer belts are partially contained within the oven, whereby said support shelves withdraw a board or board therefrom, or lay the same substrate thereon.

5. The oven of claim 1, characterized in that the transfer station of boards from the first to the second unit includes at least a pusher member and a stop member opposite thereto, connected to drive means and adapted to engage the rear and the front edges of one board at a time, in order to push it on the upper end of said second operating unit.

6. The oven of claim 1, characterized in that, in the area included between the upper ends of the first and second operating units there is provided a set of small rollers to promote sliding, adapted to support the side edges of said board, in order to allow the same to move forward towards the second operating unit.

7. The oven of claims 1 or 6, characterized in that, at the location where the board moves from the first to the second operating unit there opens the end of the hot air feeding line.

8. The oven of claim 6, characterized in that said support shelves supporting boards are sloping downwards starting from said handling chains in a symmetrical arrangement relative to each other, and said board rests on them only at the side edges thereof.

9. The oven of claim 8, characterized in that each set of support shelves is removably fastened to a support cross member which is in turn provided with a portion or extension facing towards the overlying shelf and engaged therewith.

* * * * *